United States Patent
Hill et al.

(10) Patent No.: US 7,297,581 B1
(45) Date of Patent: Nov. 20, 2007

(54) SRAM FORMATION USING SHADOW IMPLANTATION

(75) Inventors: Wiley Eugene Hill, Moss Beach, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 177 days.

(21) Appl. No.: 11/130,161

(22) Filed: May 17, 2005

Related U.S. Application Data

(62) Division of application No. 10/728,910, filed on Dec. 8, 2003, now Pat. No. 6,924,561.

(51) Int. Cl.
*H01L 21/338* (2006.01)

(52) U.S. Cl. ............... 438/176; 438/164; 438/302; 438/531; 438/525; 438/589; 438/944; 438/176; 257/E21.345; 257/E21.442

(58) Field of Classification Search .............. None
See application file for complete search history.

(56) References Cited

U.S. PATENT DOCUMENTS

| | | | |
|---|---|---|---|
| 4,996,574 A | 2/1991 | Shirasaki | 357/23.7 |
| 6,765,303 B1 | 7/2004 | Krivokapic | 257/347 |
| 6,787,406 B1 * | 9/2004 | Hill et al. | 438/164 |
| 6,855,588 B1 | 2/2005 | Liao et al. | 438/197 |
| 6,872,647 B1 | 3/2005 | Yu et al. | 438/585 |
| 6,924,561 B1 | 8/2005 | Hill et al. | 257/903 |
| 2003/0102518 A1 | 6/2003 | Fried et al. | |
| 2004/0108545 A1 | 6/2004 | Ando | 257/329 |
| 2004/0119100 A1 | 6/2004 | Nowak et al. | 257/204 |
| 2004/0188705 A1 | 9/2004 | Yeo et al. | 257/170 |
| 2004/0227187 A1 | 11/2004 | Cheng et al. | 257/347 |
| 2005/0001273 A1 | 1/2005 | Bryant et al. | 257/369 |
| 2005/0077574 A1 | 4/2005 | Mouli | 257/347 |
| 2005/0128787 A1 | 6/2005 | Mouli | 365/149 |
| 2005/0186738 A1 | 8/2005 | Hofmann et al. | 438/267 |

FOREIGN PATENT DOCUMENTS

JP   2004-281845   10/2004

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.
Yang-Kyu Choi et al., "Sub-20nm CMOS FinFET Technologies," 2001 IEEE, IEDM, pp. 421-424.

(Continued)

*Primary Examiner*—Michael Lebentritt
*Assistant Examiner*—Kyoung Lee
(74) *Attorney, Agent, or Firm*—Harrity Snyder, LLP

(57) ABSTRACT

A method of doping fins of a semiconductor device that includes a substrate includes forming multiple fin structures on the substrate, each of the fin structures including a cap formed on a fin. The method further includes performing a first tilt angle implant process to dope a first pair of the multiple fin structures with n-type impurities and performing a second tilt angle implant process to dope a second pair of the multiple fin structures with p-type impurities.

20 Claims, 14 Drawing Sheets

OTHER PUBLICATIONS

Xuejue Huang et al., "Sub-50 nm P-Channel FinFET," IEEE Transactions on Electron Devices, vol. 48, No. 5, May 2001, pp. 880-886.

Xuejue Huang et al., "Sub 50-nm FinFET: PMOS," 1999 IEEE, IEDM, pp. 67-70.

Yang-Kyu Choi et al., "Nanoscale CMOS Spacer FinFET for the Terabit Era," IEEE Electron Device Letters, vol. 23, No. 1, Jan. 2002, pp. 25-27.

Co-pending U.S. Appl. No. 10/638,334, filed Aug. 12, 2003, entitled: "Systems and Methods for Forming Dense N-Channel and P-Channel Fins Using Shadow Implantation," 16 page specification, 18 sheets of drawings.

Co-pending U.S. Appl. No. 10/429,697, filed May 6, 2003, entitled: "FinFET-Based SRAM Cell," 16 page specification, 12 sheets of drawings.

J. I. Bergman et al.: "RTD/CMOS Nanoelectric Circuits: Thin-Film InP-Based Resonant Tunneling Diodes Integrated with CMOS Circuits," IEEE Electron Device Letters, vol. 20, No. 3, Mar. 1999, pp. 119-122.

A. Seabaugh et al.: "Transistors and Tunnel Diodes For Analog/Mixed-Signal Circuits and Embedded Memory," IEDM, Dec. 8, 1998, 4 pages.

Co-pending U.S. Appl. No. 10/887,083, filed Jul. 9, 2004, entitled "Systems and Methods for forming dense n-channel and p-channel fins using shadow implanting".

* cited by examiner

SRAM FORMATION USING SHADOW IMPLANTATION

RELATED APPLICATION

The instant application is a divisional of U.S. application Ser. No. 10/728,910, filed Dec. 8, 2003 now U.S. Pat. No. 6,924,561, the disclosure of which is incorporated by reference herein.

FIELD OF THE INVENTION

The present invention relates generally to semiconductor devices and, more particularly, to systems and methods for creating static random access memory (SRAM) using shadow implanting techniques.

BACKGROUND OF THE INVENTION

The escalating demands for high density and performance associated with ultra large scale integration semiconductor devices require design features, such as gate lengths, below 100 nanometers (nm), high reliability, and increased manufacturing throughput. The reduction of design features below 100 nm challenges the limitations of conventional methodology.

Double-gate MOSFETs represent devices that are candidates for succeeding existing planar MOSFETs. In double-gate MOSFETs, the use of two gates to control the channel significantly suppresses short-channel effects. A FinFET is a double-gate structure that includes a channel formed in a vertical fin. Although a double-gate structure, the FinFET is similar to existing planar MOSFETs in layout and fabrication techniques. The FinFET also provides a range of channel lengths, CMOS compatibility, and large packing density compared to other double-gate structures.

SUMMARY OF THE INVENTION

Implementations consistent with the principles of the invention use shadow implanting of tightly spaced FinFET devices to produce high-density SRAM cells. Utilization of shadowed N/P implants permits reduction of SRAM cell size by approximately 40-50%.

In one aspect consistent with the principles of the invention, a method of doping fins of a semiconductor device that includes a substrate is provided. The method may include forming multiple fin structures on the substrate, each of the fin structures including a cap formed on a fin. The method may further include performing a first tilt angle implant process to dope a first pair of the multiple fin structures with n-type impurities and performing a second tilt angle implant process to dope a second pair of the multiple fin structures with p-type impurities.

According to a further aspect, a method may include forming a first fin and a second fin substantially parallel to one another, the first fin and the second fin having a first width and being located a first distance from one another. The method may further include forming a third fin and a fourth fin substantially parallel to one another, the third and fourth fin having the first width and being located a second distance from one another, where the second fin and the third fin are formed substantially parallel to one another and located a third distance from one another and where the third distance is greater than the first distance and the second distance. The method may also include forming a cap on each of the first, second, third and fourth fins. The method may additionally include implanting, at a first tilt angle, first vertical surfaces of the first and third fins with n-type impurities and implanting, at a second tilt angle, first vertical surfaces of the second and fourth fins with p-type impurities.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention provide techniques for fabricating high-density SRAM cells using shadowed implant techniques.

Figure 1:
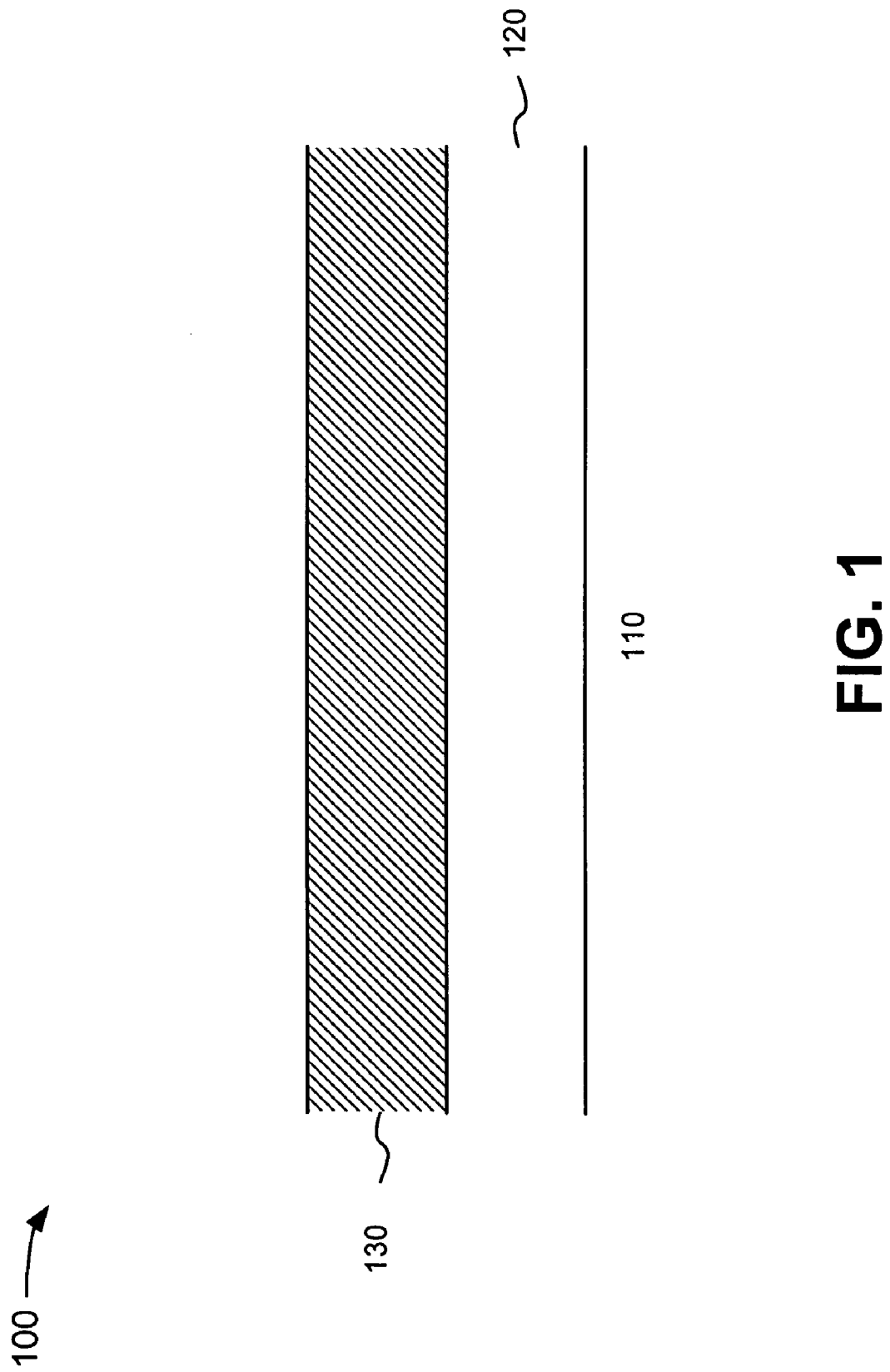
FIG. 1 illustrates a silicon on insulator structure consistent with the invention.

FIG. 1 illustrates a cross-section of a silicon on insulator (SOI) structure 100 formed in accordance with implementations consistent with the invention. SOI 100 may include a buried oxide layer on a silicon substrate (collectively shown in FIG. 1 as substrate 110) and a silicon layer 120 formed on the buried oxide layer. In alternative implementations, substrate 110 and layer 120 may include other semiconductor materials, such as germanium, or combinations of semiconductor materials, such as silicon-germanium. The buried oxide layer may include a silicon oxide or other types of dielectric materials.

Silicon layer 120 may be formed on substrate 110 using a conventional deposition technique. The thickness of silicon layer 120 may range from about 50 Å to 500 Å. In an exemplary implementation, silicon layer 120 may be deposited to a thickness of approximately 50 Å. It will be appreciated that silicon layer 120 may be used to form one or more fins.

A thick cap layer 130 (or hard mask) may be formed on top of silicon layer 120 to aid in pattern optimization and protect silicon layer 120 during subsequent processing. Cap layer 130 may, for example, include a silicon nitride material or some other type of material capable of protecting silicon layer 120 during the fabrication process. Cap layer 130 may be deposited, for example, by chemical vapor deposition (CVD) to a thickness ranging from approximately 50 Å to 200 Å. In an exemplary implementation, cap layer 130 may be deposited to a thickness of approximately 50 Å.

Figure 2A:
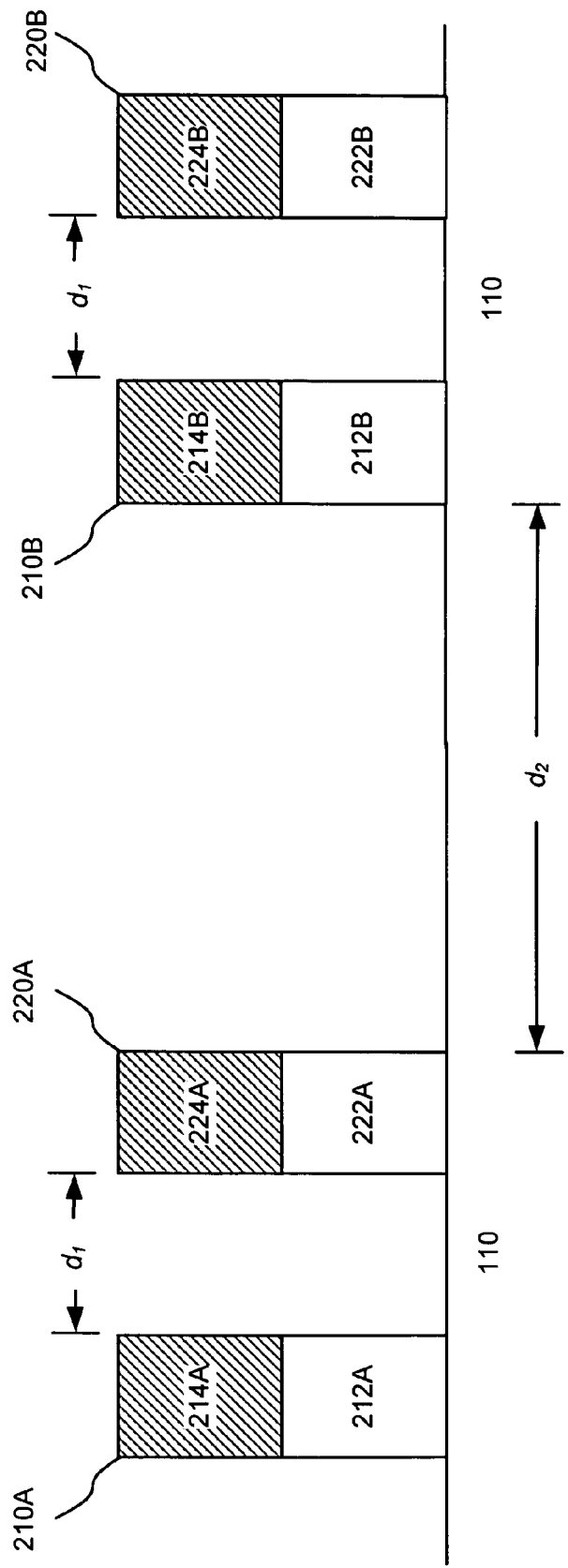
FIGS. 2A and 2B illustrate exemplary fin formation consistent with the invention.
Figure 2B:
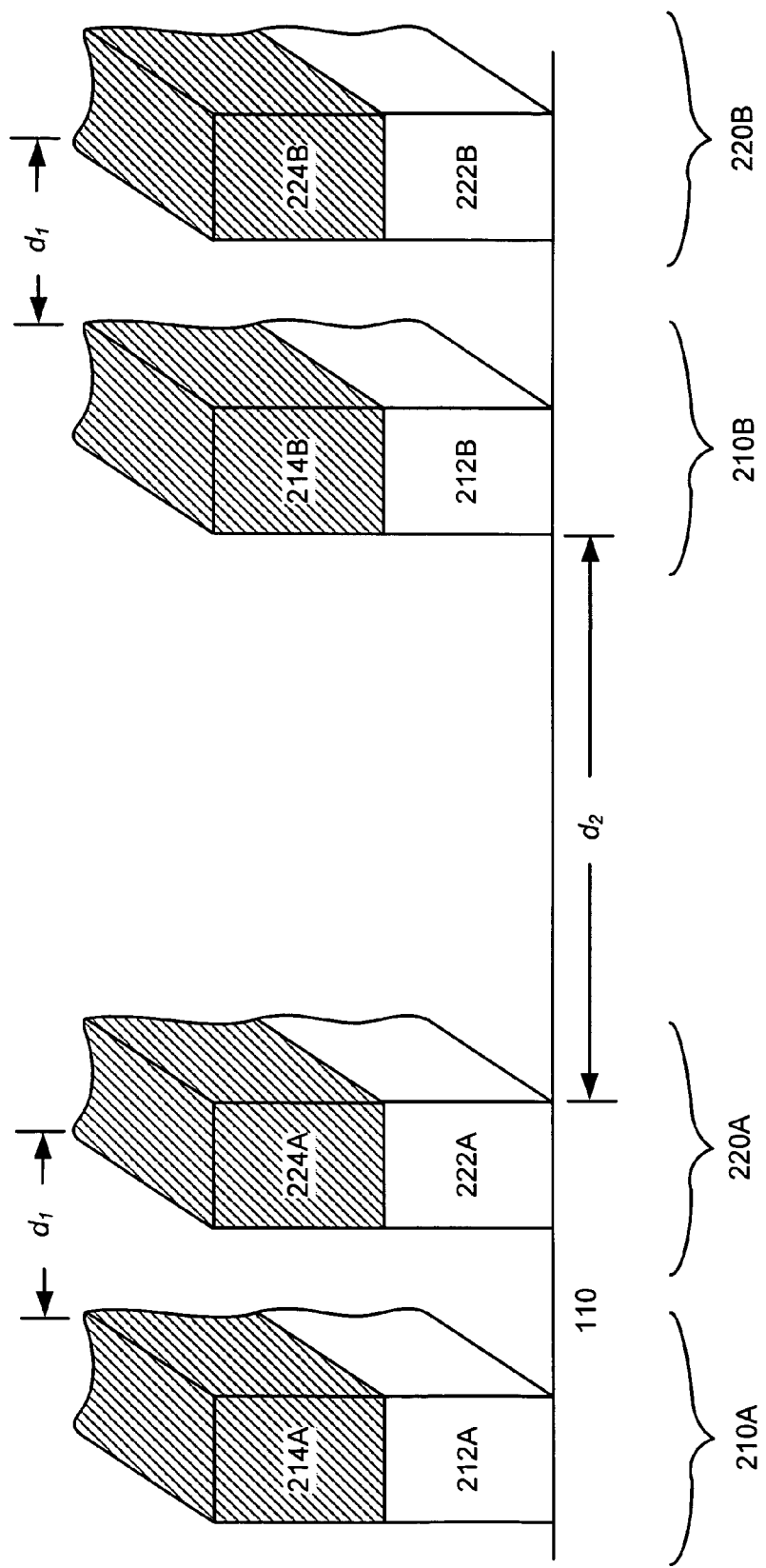

Silicon layer 120 may be patterned by conventional lithographic techniques (e.g., optical or electron beam (EB) lithography). Silicon layer 120 may then be etched using well-known etching techniques to form multiple fin structures 210A, 2101B, 220A and 220B, as illustrated in FIG. 2A. FIG. 2B shows a three dimensional view of FIG. 2A.

As shown in FIGS. 2A and 2B, fin structure 210A/220A includes a fin 212A/222A and a cap 214A/224A and fin structure 210B/220B includes a fin 212B/222B and a cap 214B/224B. Caps 214A/224A may remain covering fin 212A/222A and caps 214B/224B may remain covering fin 212B/222B. The width of fin structures 210A, 220A, 210B and 220B may range from approximately 50 Å to 500 Å. In an exemplary implementation, the width of each of fin structures 210A, 220A, 210B and 220B may be approximately 50 Å. A distance $d_1$ between side surfaces of fin structure 210A and fin structure 220A and between side surfaces of fin structure 210B and 220B may be approximately twice the width of fin structures 210A and 220A. $d_1$ may, thus, range from approximately 100 Å to 1000 Å. A distance $d_2$ between side surfaces of fin structure 220A and 210B may be approximately four times the width of fin structures 220A and 210B. $d_2$ may, thus, range from approximately 200 Å to 2000 Å. In one implementation, for example, the distance $d_1$ may be approximately 100 Å and the distance $d_2$ may be approximately 200 Å.

Figure 3A:
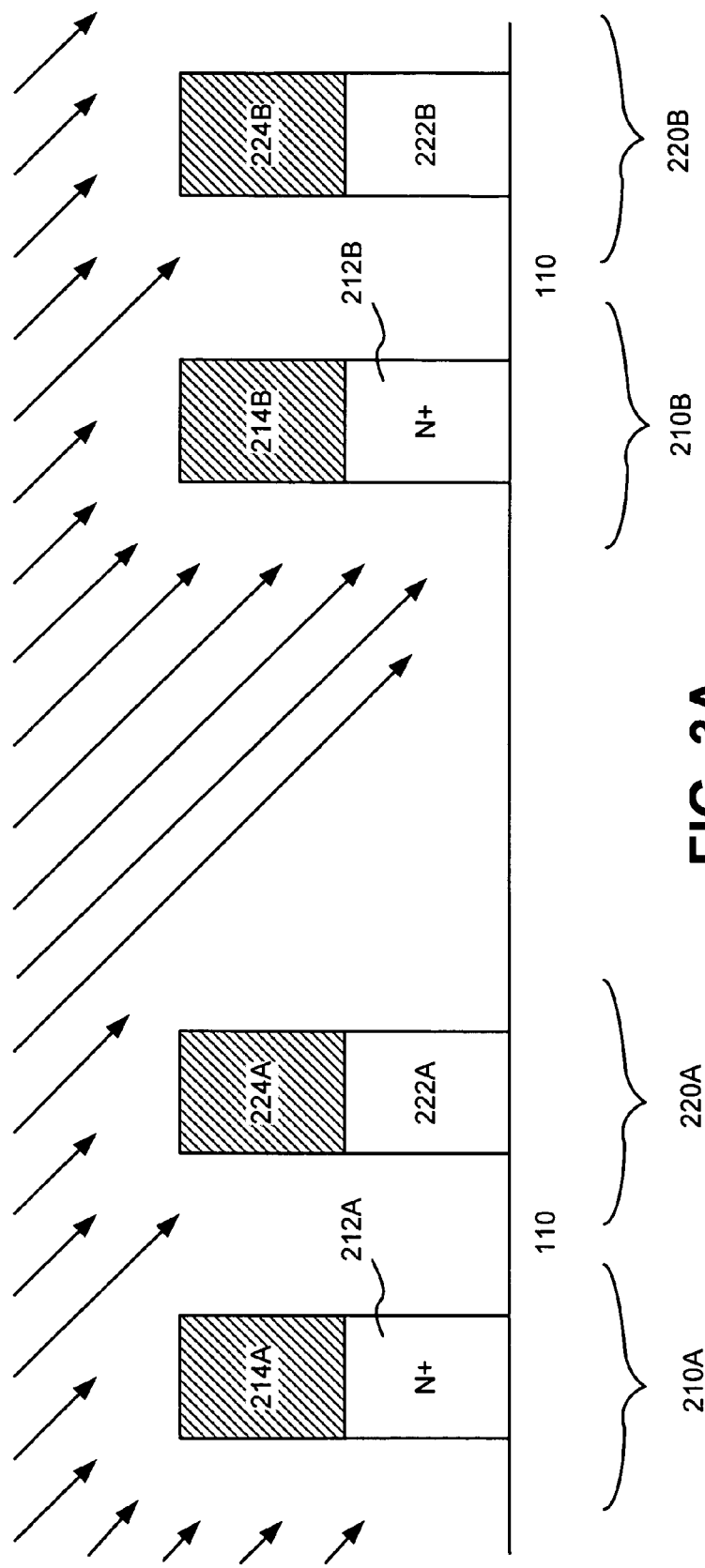
FIGS. 3A and 3B illustrate exemplary N implantation using shadowing techniques consistent with the invention.
Figure 3B:
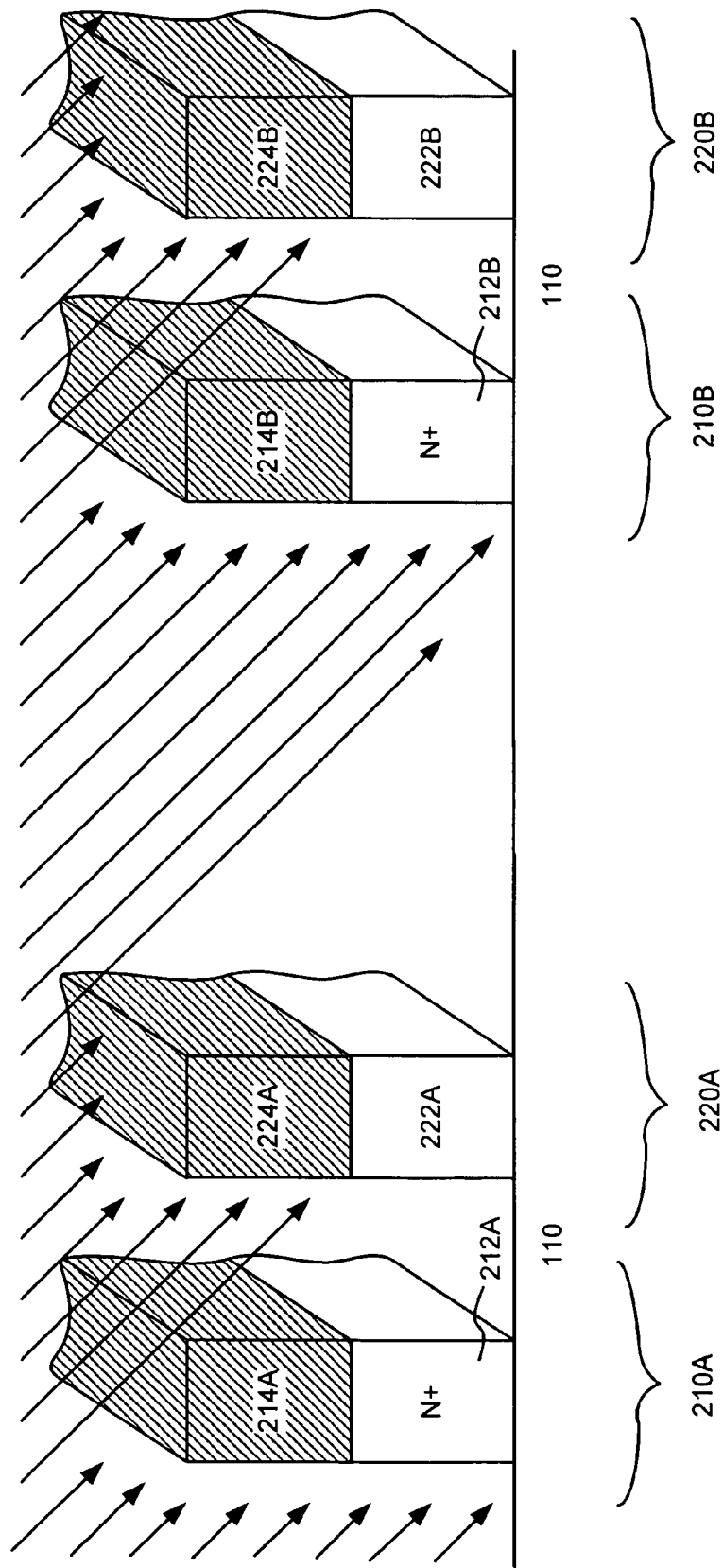

A tilt angle implant process may then be performed to dope fins 212A, 212B, 222A and 222B. For example, a conventional implant process of n-type impurities, such as arsenic or phosphorus, may be performed to dope fins 212A and 212B, as illustrated in FIG. 3A. FIG. 3B shows a three dimensional view of FIG. 3A. As shown in FIGS. 3A and 3B, n-type impurities may be implanted at an angle ranging from approximately 40 degrees to 50 degrees. In an exemplary implementation, the implant process may be performed at an angle of approximately 45 degrees. The particular angle used may be dependent upon the height of cap 214/224. For example, if the height of cap 214/224 is approximately equal to the height of fin 212/222, then the angle used may be less than or equal to 45 degrees.

The n-type impurities may be implanted at a dosage of about $5 \times 10^{14}$ atoms/cm$^2$ to about $1 \times 10^{15}$ atoms/cm$^2$ and an implantation energy of about 3-6 KeV for phosphorus or about 5-10 KeV for arsenic, which may depend on the thickness of fin 212. After the implant process is complete, fins 212A and 212B may include silicon doped predominately, or only, with n-type impurities, as illustrated in FIGS. 3A and 3B.

As shown in FIGS. 3A and 3B, the implanting of n-type impurities does not dope fins 222A and 222B. There are several factors that aid in preventing the n-type impurities from reaching fins 222A and 222B. For example, the presence, height, and closeness of fin structure 210 shields or shadows fin 222, thereby blocking the n-type impurities from reaching fin 222. The presence of cap 224 also helps block the n-type impurities.

Figure 4A:
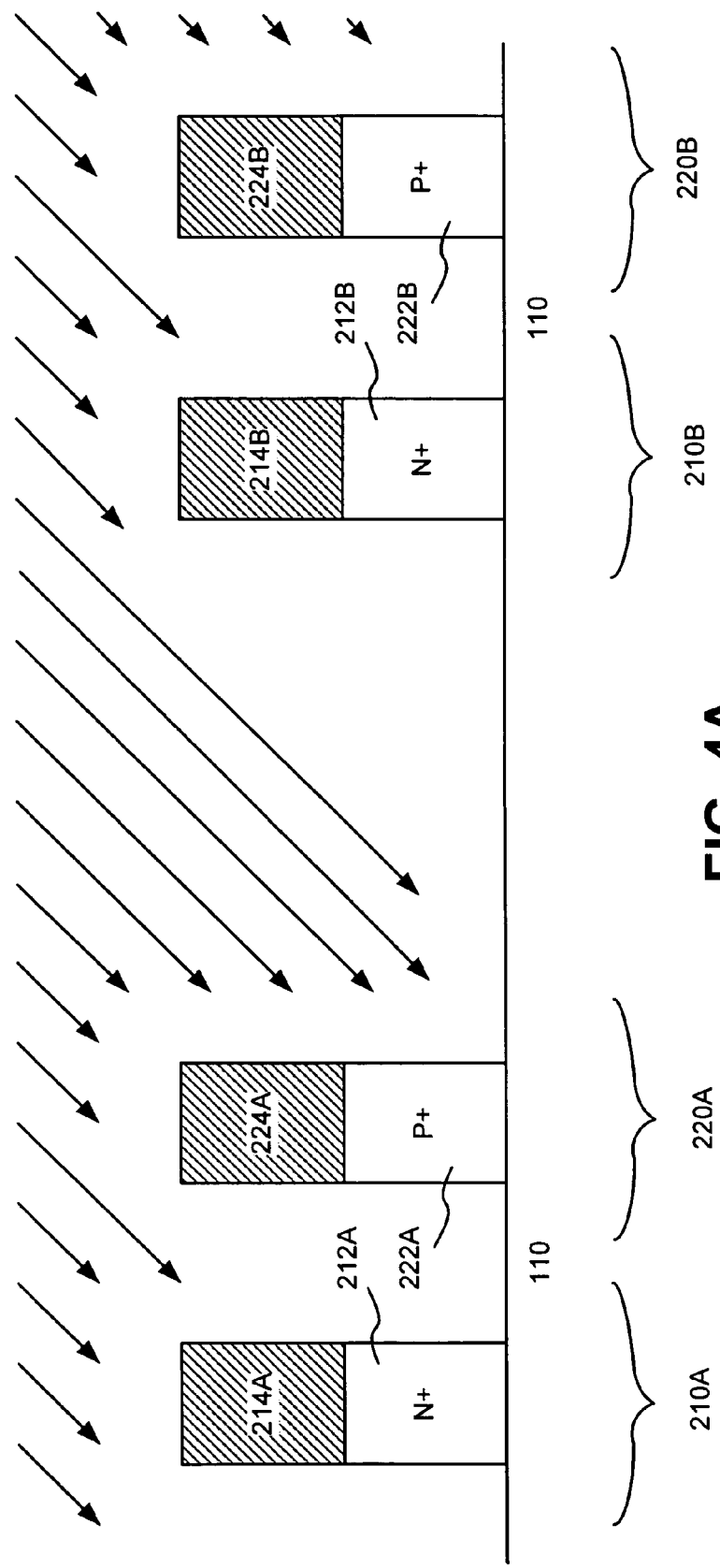
FIGS. 4A and 4B illustrate exemplary P implantation using shadowing techniques consistent with the invention.
Figure 4B:
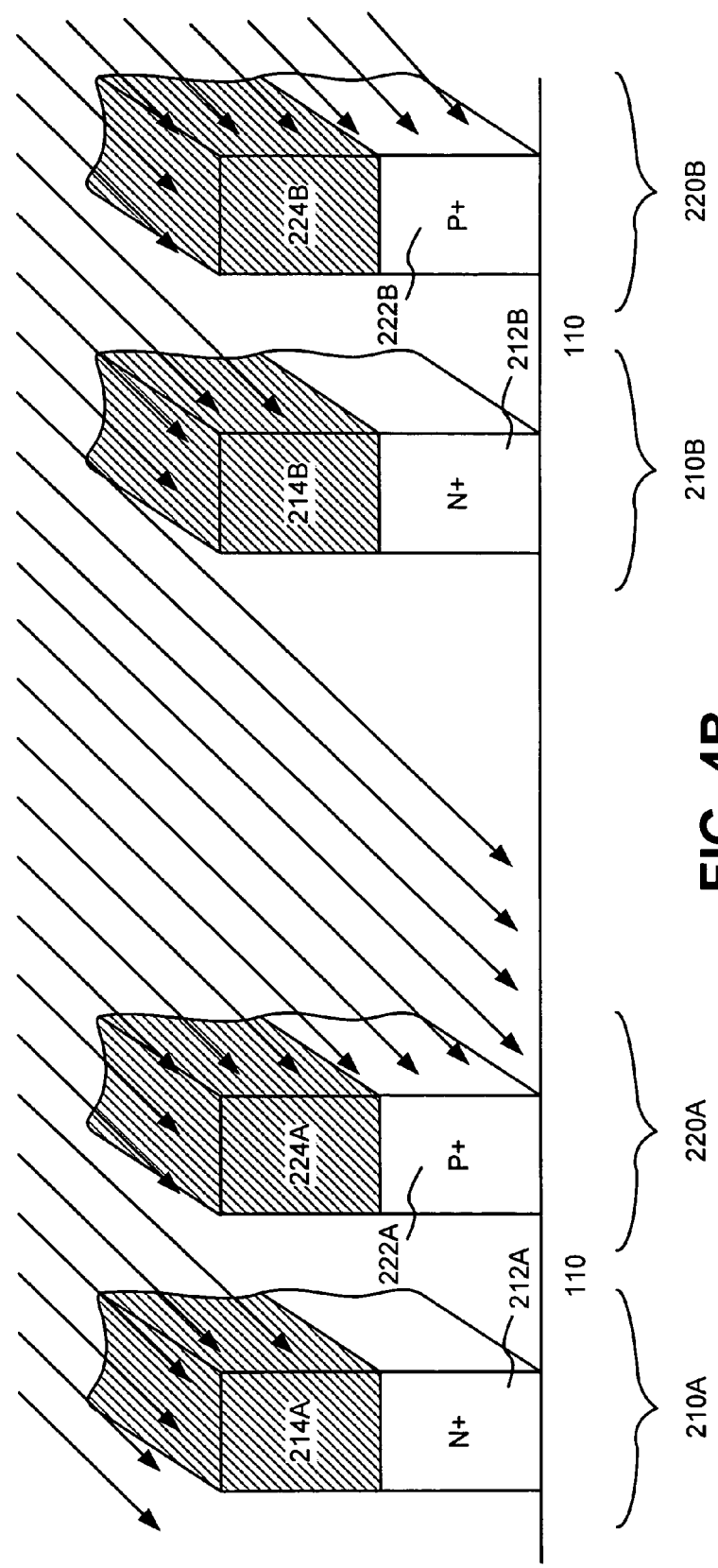

A tilt angle implant process of p-type impurities, such as boron or $BF_2$, may be performed to dope fins 222A and 222B, as illustrated in FIG. 4A. FIG. 4B shows a three dimensional view of FIG. 4A. As shown in FIGS. 4A and 4B, p-type impurities may be implanted at an angle ranging from approximately 40 degrees to 50 degrees. In an exemplary implementation, the implant process may be performed at an angle of approximately 45 degrees. The particular angle used may be dependent upon the height of cap 214/224. For example, if the height of cap 214/224 is approximately equal to the height of fin 212/222, then the angle used may be less than or equal to 45 degrees.

The p-type impurities may be implanted at a dosage of about $5 \times 10^{14}$ atoms/cm$^2$ to about $1 \times 10^{15}$ atoms/cm$^2$ and an implantation energy of about 2 KeV to about 3 KeV for boron, which may depend on the thickness of fin 222. After the implant process is complete, fins 222A and 222B may include silicon doped predominately, or only, with p-type impurities, as illustrated in FIGS. 4A and 4B.

As shown in FIGS. 4A and 4B, the implanting of p-type impurities does not dope fins 212A and 212B. There are several factors that aid in preventing the p-type impurities from reaching fins 212A and 212B. For example, the presence, height, and closeness of fin structure 220 shields or shadows fin 212 blocks the p-type impurities from reaching fin 212. The presence of cap 224 also helps block the p-type impurities.

It may also be desirable to dope fins 212 and 222 from the other side (i.e., the sides of fins 212 and 222 facing each other). This may be desirable in instances where the dopant does not fully dope fins 212 and 222.

Figure 5A:
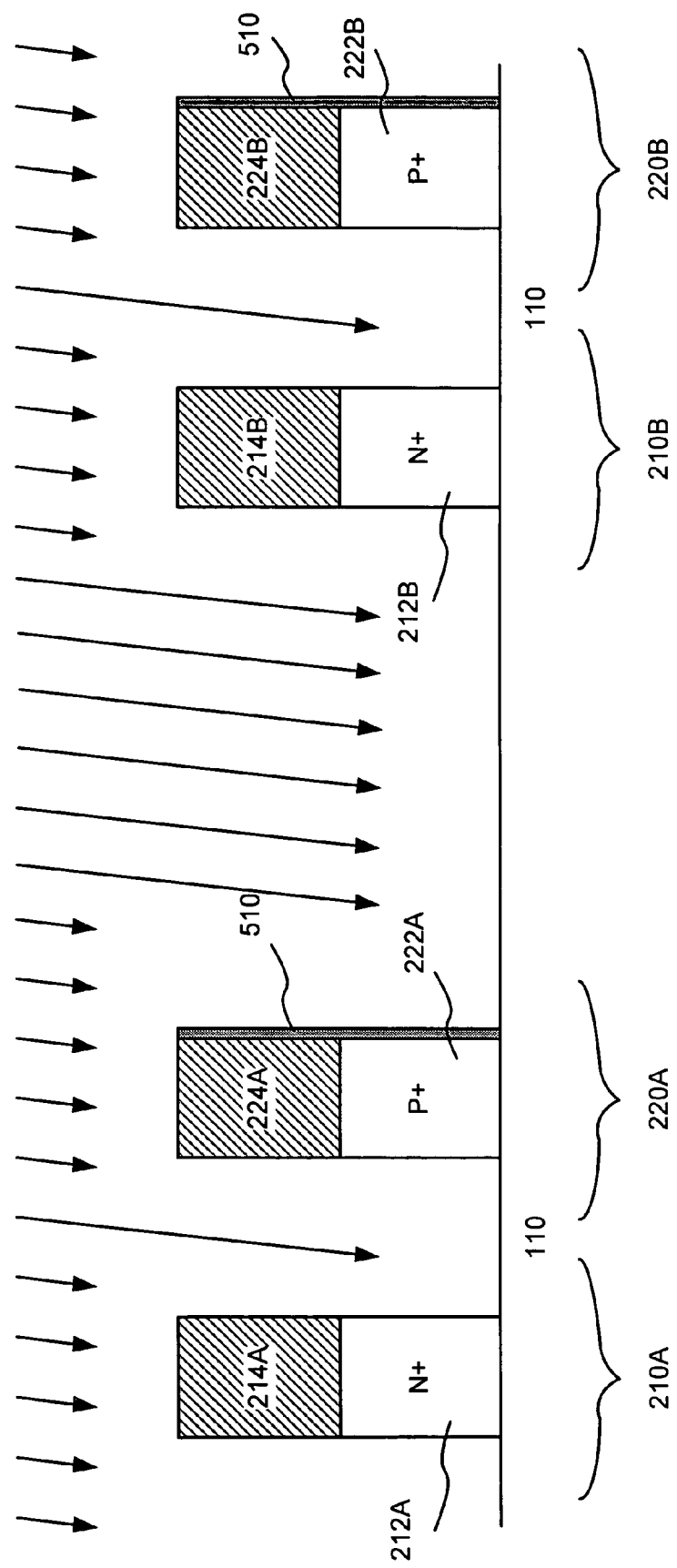
FIGS. 5A, 5B, 6A and 6B illustrate additional shadow implantation techniques consistent with the invention.
Figure 5B:
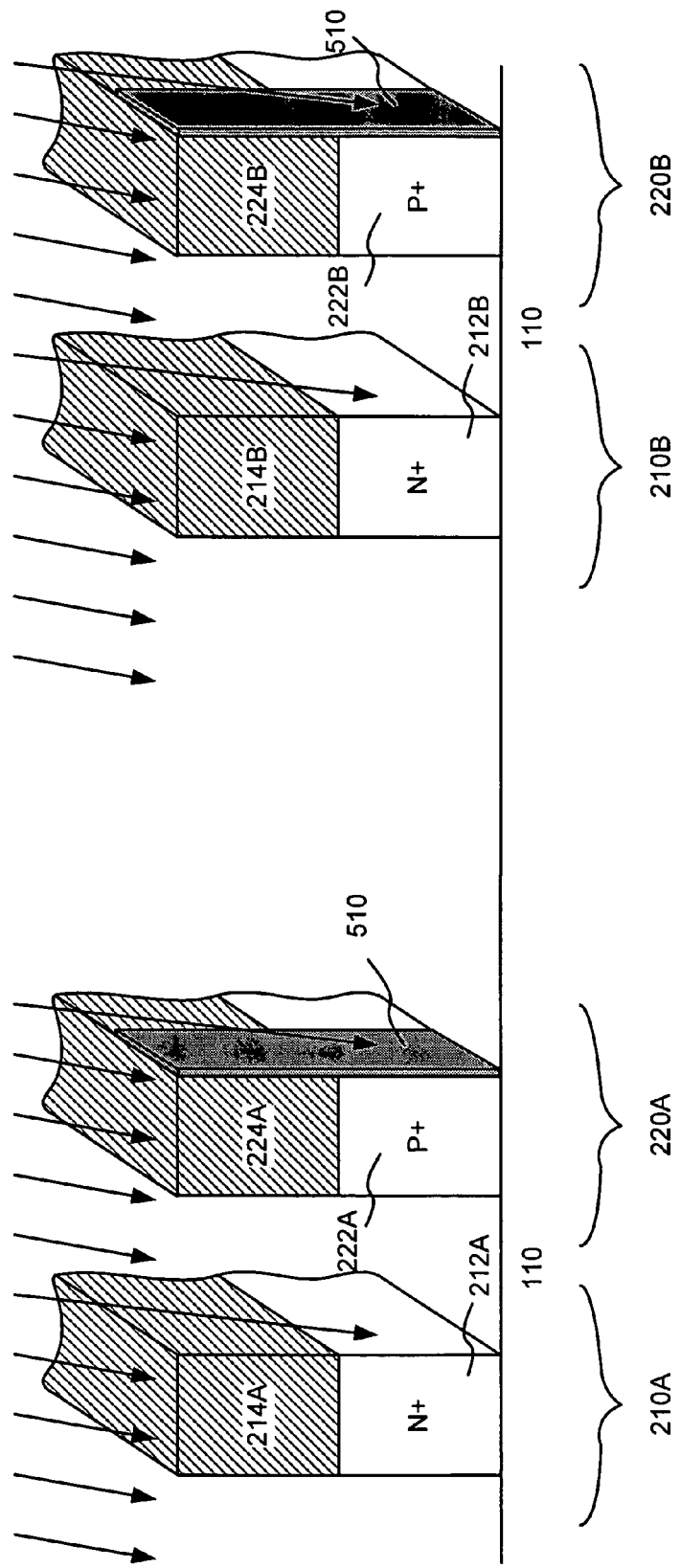

In this case, a hardened resist may optionally be formed on non-shadowed sides of fin structures 210 and 220. Another group of tilt angle implant processes may then optionally be performed to dope fins 212A, 212B, 222A and 222B. For example, a hardened resist 510 may be formed on the non-shadowed side surface of fin structure 220, as illustrated in FIG. 5A. FIG. 5B shows a three dimensional view of FIG. 5A. Resist 510 may be formed to a thickness ranging from approximately 100 Å to 200 Å. In an exemplary implementation, resist 510 may be formed to a thickness of approximately 150 Å. While FIG. 5B shows resist 510 covering only a portion of fin structure 220, resist 510 may be formed to cover the entire non-shadowed side of fin structure 220.

A conventional implant process of n-type impurities, such as arsenic or phosphorus, may be performed to dope fins 212A and 212B, as illustrated in FIGS. 5A and 5B. The n-type impurities may be implanted at an angle ranging from approximately 40 degrees to 50 degrees. In an exemplary implementation, the implant process may be performed at an angle of approximately 45 degrees.

The n-type impurities may be implanted at a dosage of about $5 \times 10^{14}$ atoms/cm$^2$ to about $1 \times 10^{15}$ atoms/cm$^2$ and an implantation energy of about 3-6 KeV for phosphorus or about 5-10 KeV for arsenic, which may depend on the thickness of fin 212. After the implant process is complete, fins 212A and 212B may include silicon doped predominately, or only, with n-type impurities, as illustrated in FIGS. 5A and 5B. The implanting of n-type impurities does not dope fins 222A and 222B. For example, resist 510 and cap 224 block the n-type impurities from reaching fins 222A and 222B.

Figure 6A:
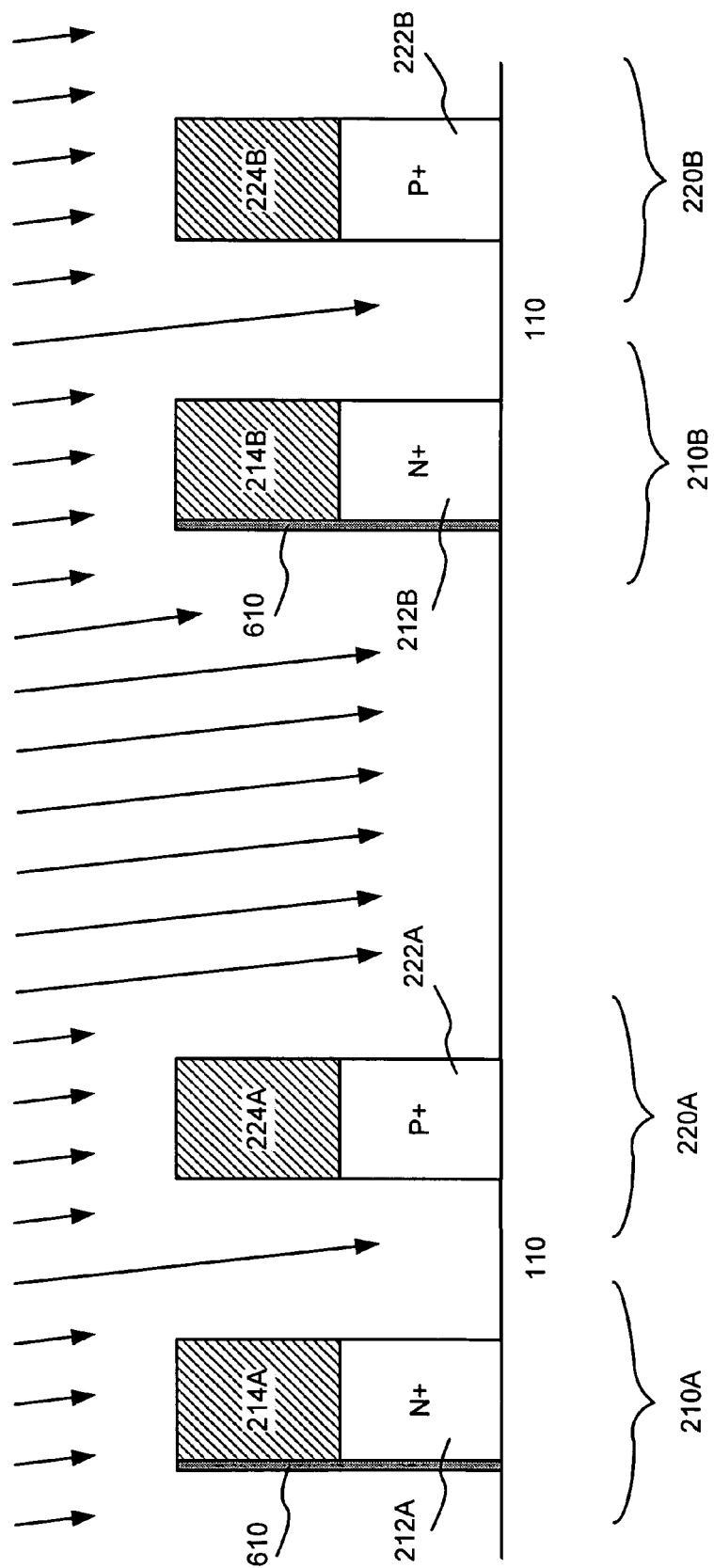
Figure 6B:
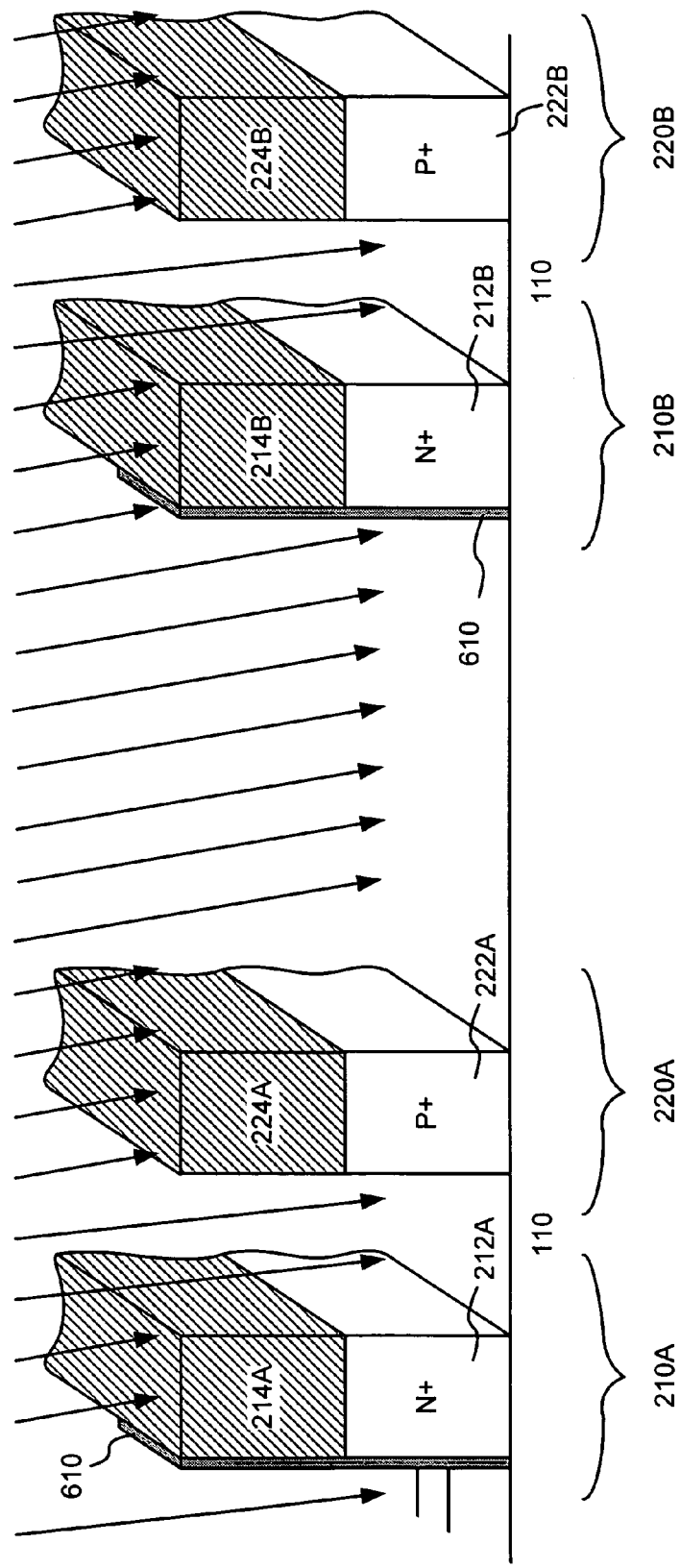

A hardened resist 610 may optionally be formed on the non-shadowed side surface of fin structures 212A and 212B, as illustrated in FIG. 6A. FIG. 6B shows a three dimensional view of FIG. 6A. Resist 610 may be formed to a thickness ranging from approximately 100 Å to 200 Å. In an exemplary implementation, resist 610 may be formed to a thickness of approximately 150 Å. While FIG. 6B shows resist 610 covering only a portion of fin structures 210A and 210B, resist 610 may be formed to cover the entire non-shadowed side of fin structures 210A and 210B.

A conventional implant process of p-type impurities, such as boron or $BF_2$, may then be optionally performed to dope fins 222A and 222B, as illustrated in FIGS. 6A and 6B. The p-type impurities may be implanted at an angle ranging from approximately 40 degrees to 50 degrees. In an exemplary implementation, the implant process may be performed at an angle of approximately 45 degrees.

The p-type impurities may be implanted at a dosage of about $5 \times 10^{14}$ atoms/cm$^2$ to about $1 \times 10^{15}$ atoms/cm$^2$ and an implantation energy of about 2 KeV to about 3 KeV for boron, which may depend on the thickness of fins 222A and 222B. After the implant process is complete, fins 222A and 222B may include silicon doped predominately, or only, with p-type impurities, as illustrated in FIGS. 6A and 6B. The implanting of p-type impurities does not dope fins 212A and 212B. For example, resist 610 and cap 214 block the p-type impurities from reaching fin 212.

After doping of fins 212A, 212B, 222A and 222B, conventional FinFET fabrication processing can be used to complete the transistor (e.g., forming the source and drain regions, contacts, interconnects and inter-level dielectrics for the FinFET device). For example, any remaining resist 510 or 610 may be stripped. Also, caps 214 and 224 may be removed.

Figure 7:
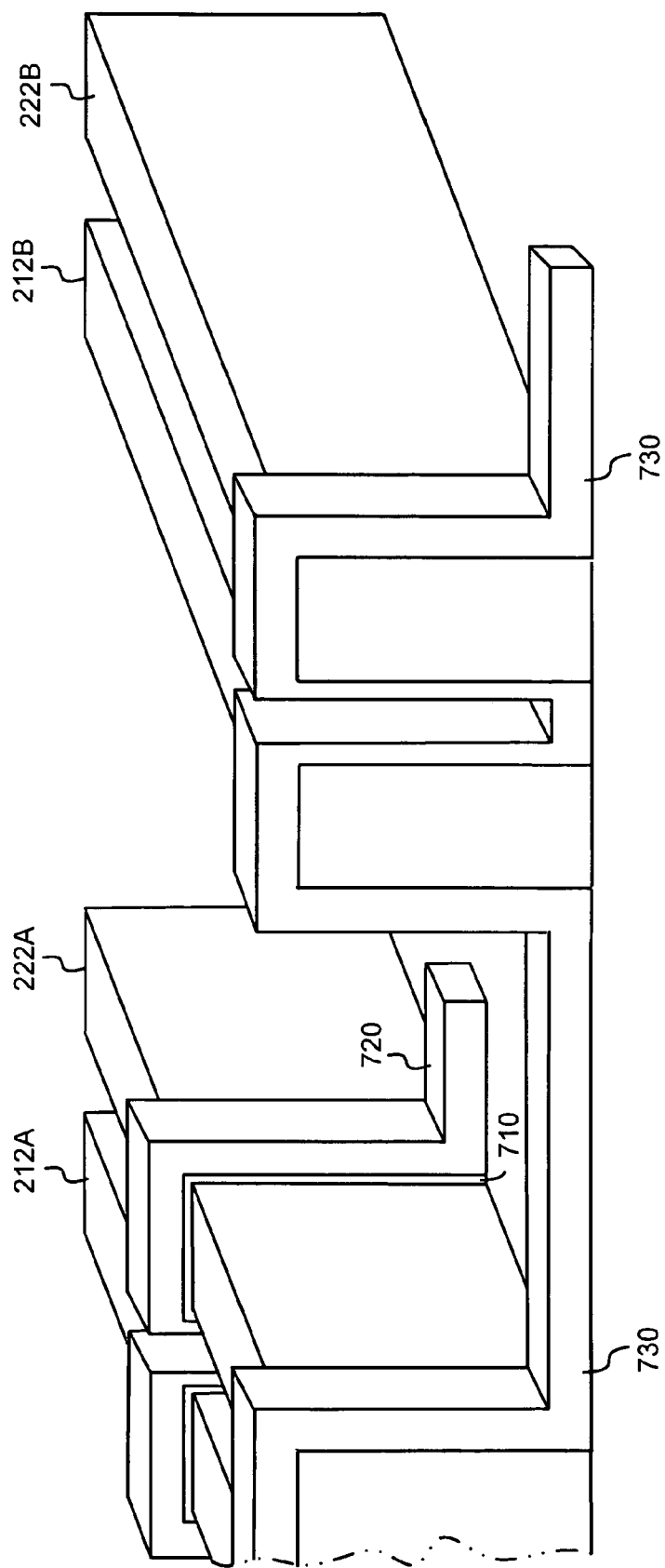
FIG. 7 illustrates exemplary gate and M1 jumper formation consistent with the invention.
Figure 8:
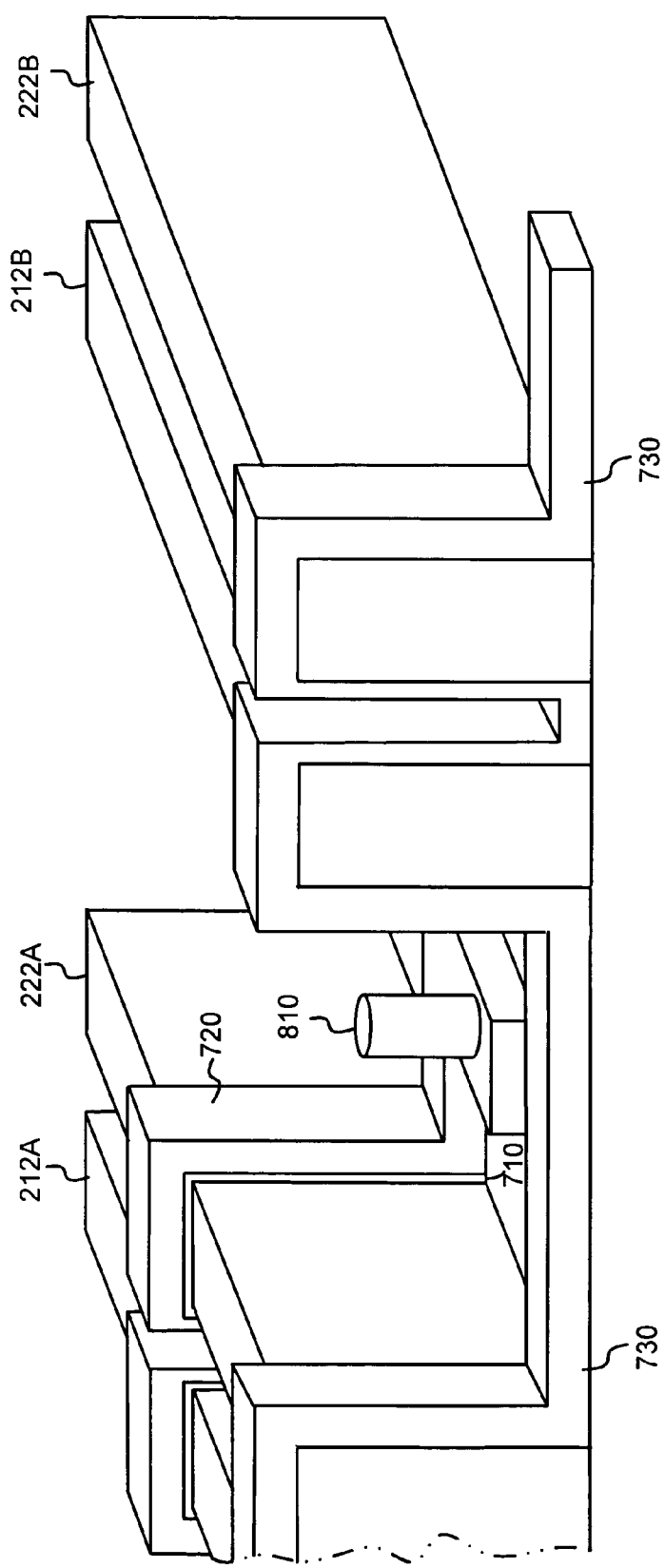
FIG. 8 illustrates exemplary gate interconnect formation consistent with the invention.

As illustrated in FIG. 7, a selective oxide strip 710 may be grown on fins 212A and 222A. Oxide strip 710 maybe etched and a gate 720 and M1 jumper 730 maybe formed by depositing and patterning polysilicon over fins 212A, 222A, 212B and 222B, as illustrated in FIG. 7. Polysilicon may then be deposited and patterned for forming the contacts and interconnect 810, as illustrated in FIG. 8.

Figure 9:
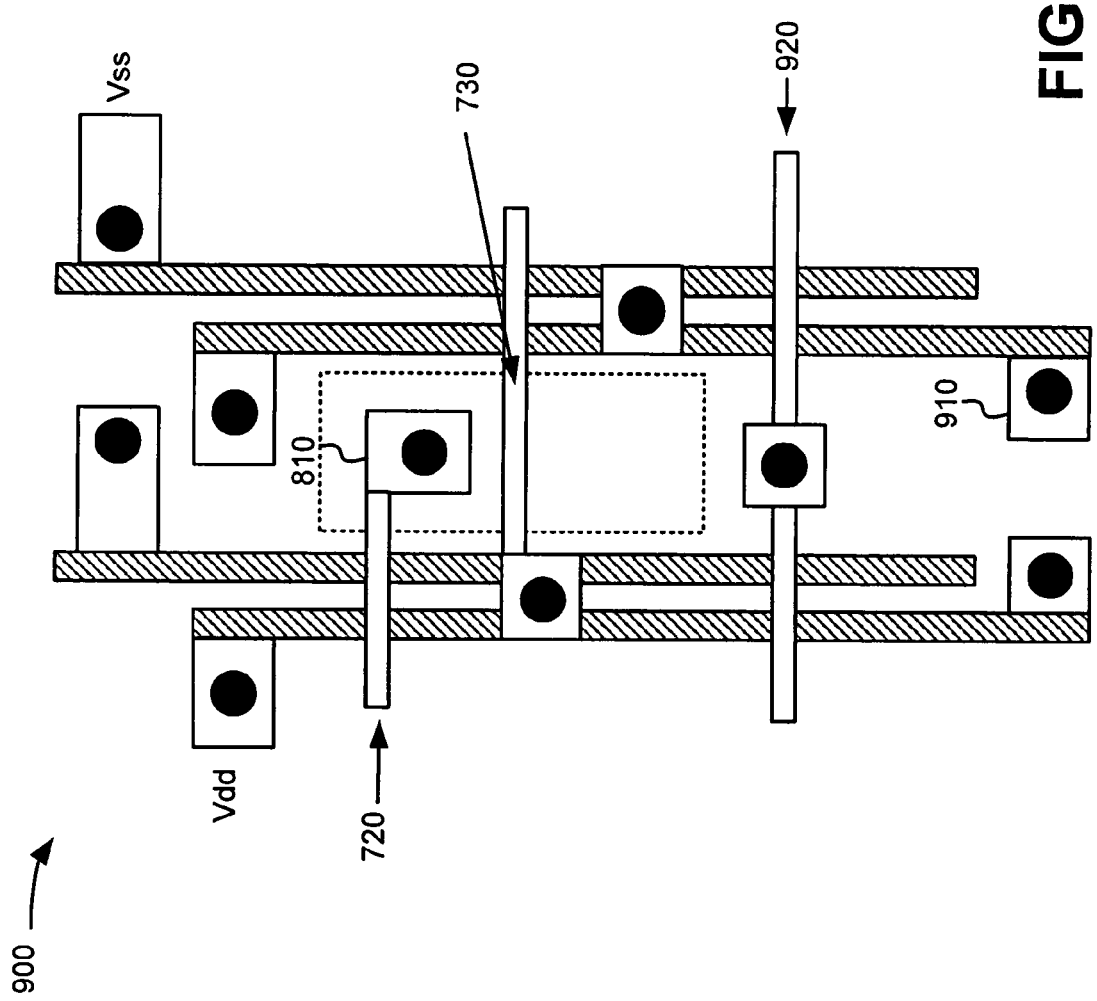
FIG. 9 illustrates an exemplary SRAM formed using shadow implantation techniques consistent with the invention.

Conventional processing may then be performed to complete the SRAM device. FIG. 9 illustrates a FinFET SRAM device 900 that may be formed from the above-processing. As illustrated, SRAM device 900 includes a group of separate M2 bitline contacts 910, an M1 wordline 920, an M1 jumper 730, a gate 720, and a gate interconnect 810.

CONCLUSION

Systems and methods consistent with the principles of the invention provide tightly spaced n-channel and p-channel fins for a SRAM cell. In implementations consistent with the present invention, the fins may be doped using shadowed implant techniques.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention.

For example, in the above descriptions, numerous specific details are set forth, such as specific materials, structures, chemicals, processes, etc., in order to provide a thorough understanding of implementations consistent with the present invention. These implementations and other implementations can be practiced, however, without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIGS. 1-9, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A method of doping fins of a semiconductor device that includes a substrate, the method comprising:
   forming a plurality of fin structures on the substrate, each of the fin structures including a cap formed on a fin;
   performing a first tilt angle implant process to dope a first pair of the plurality of fin structures with n-type impurities; and
   performing a second tilt angle implant process to dope a second pair of the plurality of fin structures with p-type impurities.

2. The method of claim 1, wherein a width of each of the fin structures ranges from about 50 Å to about 500 Å.

3. The method of claim 1, wherein a first distance between a first fin structure of the plurality of fin structures and a second fin structure of the plurality of fin structures ranges from about 100 Å to about 1000 Å and a second distance between the second fin structure and a third fin structure of the plurality of fin structures ranges from about 200 Å to about 2000 Å.

4. The method of claim 1, wherein a height of each of the fins ranges from about 50 Å to about 500 Å.

5. The method of claim 1, wherein the first tilt angle implant process is performed at an angle ranging from about 40 degrees to about 50 degrees.

6. The method of claim 1, wherein the second tilt angle implant process is performed at an angle ranging from about 40 degrees to about 50 degrees.

7. The method of claim 1, further comprising:
   performing a third tilt angle implant process to further dope the first pair of the plurality of fin structures with n-type impurities; and
   performing a fourth tilt angle implant process to further dope the second pair of the plurality of fin structures with p-type impurities.

8. The method of claim 7, wherein the third tilt angle implant process is performed at an angle ranging from about 40 degrees to about 50 degrees.

9. The method of claim 7, wherein the fourth tilt angle implant process is performed at an angle ranging from about 40 degrees to about 50 degrees.

10. A method, comprising:
    forming a first fin and a second fin substantially parallel to one another, the first fin and the second fin having a first width and being located a first distance from one another;
    forming a third fin and a fourth fin substantially parallel to one another, the third and fourth fin having the first width and being located a second distance from one another, wherein the second fin and the third fin are formed substantially parallel to one another and located a third distance from one another and wherein the third distance is greater than the first distance and the second distance;
    forming a cap on each of the first, second, third and fourth fins;
    implanting, at a first tilt angle, first vertical surfaces of the first and third fins with n-type impurities; and
    implanting, at a second tilt angle, first vertical surfaces of the second and fourth fins with p-type impurities.

11. The method of claim 10, wherein the first and second distances are approximately twice the first width and wherein the third distance is approximately four times the first width.

12. The method of claim 10, further comprising:
   implanting, at a third tilt angle, second vertical surfaces of the first and third fins with n-type impurities; and
   implanting, at a fourth tilt angle, second vertical surfaces of the second and fourth fins with p-type impurities.

13. The method of claim 10, wherein the first tilt angle comprises an angle to the first vertical surfaces of the first and third fins ranging from about 40 degrees to about 50 degrees.

14. The method of claim 13, wherein the second tilt angle comprises an angle to the first vertical surfaces of the second and fourth fins ranging from about 40 degrees to about 50 degrees.

15. The method of claim 12, wherein the third tilt angle comprises an angle to the second vertical surfaces of the first and third fins ranging from about 40 degrees to about 50 degrees.

16. The method of claim 15, wherein the fourth tilt angle comprises an angle to the second vertical surfaces of the second and fourth fins ranging from about 40 degrees to about 50 degrees.

17. The method of claim 12, further comprising:
   forming a layer of resist material on the first vertical surfaces of the second and fourth fins prior to implanting at the third tilt angle; and
   forming a layer of resist material on the first vertical surfaces of the first and third fins prior to implanting at the fourth tilt angle.

18. The method of claim 10, wherein the first width ranges from about 50 Å to about 500 Å.

19. The method of claim 10, wherein the cap is formed to a thickness ranging from about 50 Å to about 200 Å.

20. The method of claim 10, wherein implanting the first vertical surfaces of the first and third fins with n-type impurities comprises:
   implanting phosphorous at an implantation energy of about 3-6 KeV or arsenic at an implantation energy of about 5-10 KeV,
   wherein implanting the first vertical surfaces of the second and fourth fins with p-type impurities comprises:
   implanting boron at an implantation energy of about 2-3 KeV.

* * * * *

UNITED STATES PATENT AND TRADEMARK OFFICE
CERTIFICATE OF CORRECTION

PATENT NO. : 7,297,581 B1 Page 1 of 1
APPLICATION NO. : 11/130161
DATED : November 20, 2007
INVENTOR(S) : Hill et al.

It is certified that error appears in the above-identified patent and that said Letters Patent is hereby corrected as shown below:

At column 3, line 7, "2101B" should be --210B--

Signed and Sealed this

Eighteenth Day of March, 2008

JON W. DUDAS
*Director of the United States Patent and Trademark Office*